United States Patent [19]

Watarai

[11] Patent Number: 5,563,542
[45] Date of Patent: Oct. 8, 1996

[54] OUTPUT CIRCUIT FOR GUNNING TRANSCEIVER LOGIC

[75] Inventor: Seiichi Watarai, Tokyo, Japan

[73] Assignee: NEC Corporation, Tokyo, Japan

[21] Appl. No.: 532,986

[22] Filed: Sep. 22, 1995

[30] Foreign Application Priority Data

Sep. 27, 1994 [JP] Japan ............... 6-231257

[51] Int. Cl.⁶ ............................................. H03K 17/16
[52] U.S. Cl. ................. 327/382; 327/109; 327/110; 327/396; 327/389
[58] Field of Search ................. 327/109–10, 396, 327/382, 389

[56] References Cited

U.S. PATENT DOCUMENTS 5,023,488  6/1991  Gunning ............... 307/475
5,347,169  9/1994  Preslar et al. ............... 327/110

*Primary Examiner*—Margaret Rose Wambach
*Attorney, Agent, or Firm*—Young & Thompson

[57] ABSTRACT

In a GTL circuit for restraining a ringing occurred by parasitic active elements on a package and a transmission path, the GTL circuits comprises two NMOS transistors connected in series to each other, for restraining a ringing between the gate and drain of an open drain type NMOS transistor which drives an output potential, and a plurality of delay circuits connected in series, for controlling periodically a current flowing through the two NMOS transistors, thereby reducing the ringing exceedingly the ringing caused by extremely large inductive elements which are connected to an output terminal as loads, and achieving a high speed operation of the GTL circuit.

6 Claims, 3 Drawing Sheets

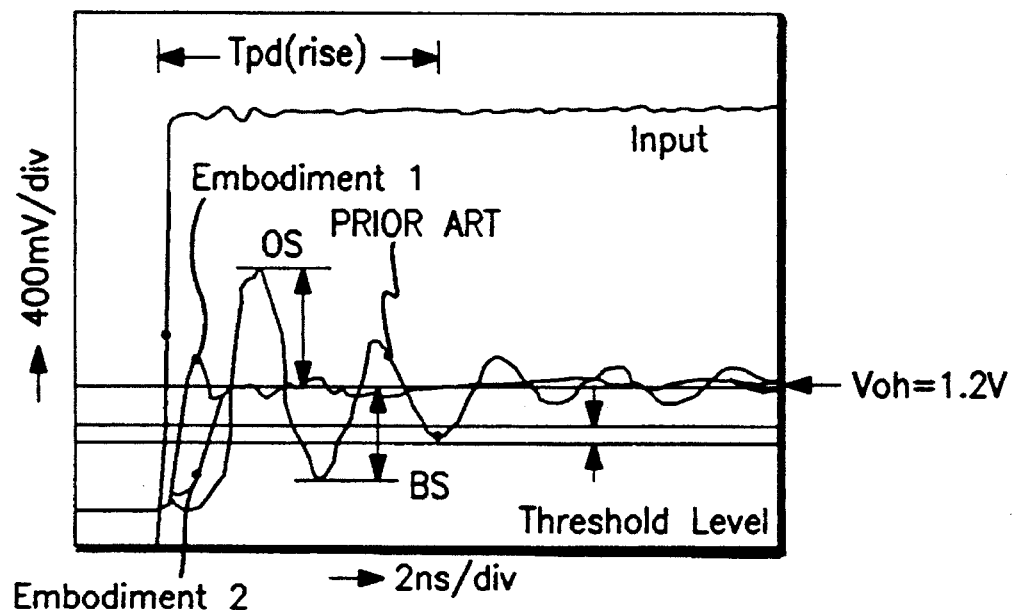
FIG. 4
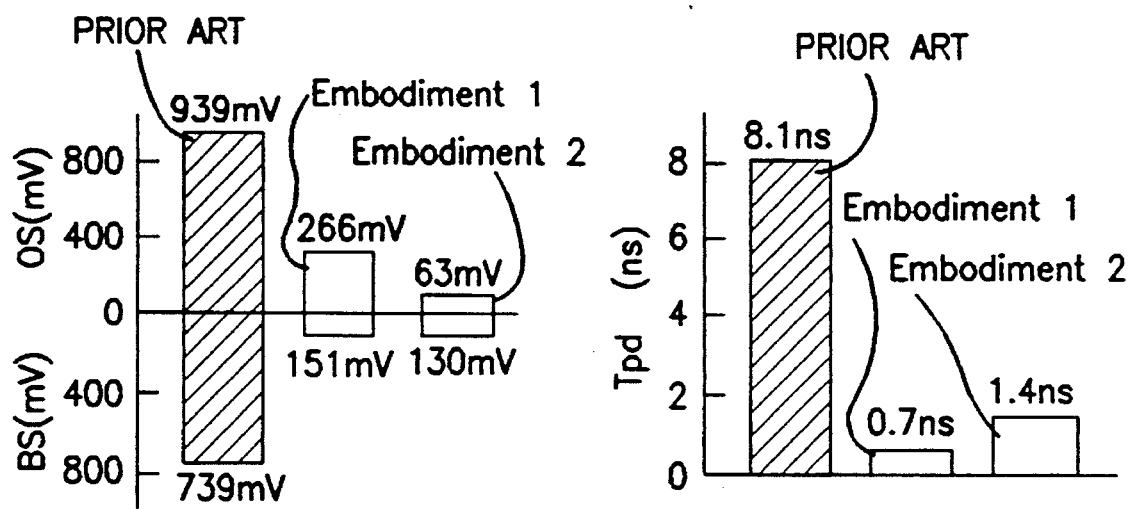
FIG. 5A
FIG. 5B 5,563,542

1

OUTPUT CIRCUIT FOR GUNNING TRANSCEIVER LOGIC

BACKGROUND OF THE INVENTION

The present invention relates to an output circuit employed in a semiconductor integrated circuit and, more particularly, to an output circuit of an open drain type, incorporated in each of semiconductor integrated circuits, for driving a transmission line through which the circuits are interconnected.

As one of such output circuits, there has been known a Gunning Transceiver Logic output circuit (hereinafter referred to as a GTL output circuit). This GTL output circuit is disclosed in U.S. Pat. No. 5,023,488 and is employed to communicate data between a plurality of integrated circuit devices. These devices are inter-connected through a transmission line which is in turn short-circuited to a potential of a range from 1.2 to 2V, by the use of a resistance elements having its characteristic impedance equal to that of the transmission line. The GTL output circuit in each devices drives the transmission line with a logical amplitude having an amplitude of about 0.8 to 1.4V.

FIG. 3 is a circuit diagram showing a detail configuration of the above GTL output circuit. In this circuit, a P-channel MOS transistor (hereinafter referred to as a PMOS transistor) 1 and an N-channel MOS transistor (hereinafter referred to as an NMOS transistor) are connected in series between a power source line VDD and an earth or ground line GND. These lines are formed on a semiconductor integrated circuit chip. The common connected node of the transistors 1 and 2 is connected to the gate of an NMOS transistor 3. The gates of the PMOS and NMOS transistors 1 and 2 are connected in common to a data input terminal VIN. The drain of the NMOS transistor 3 is connected to an output terminal pad VOUT. Since this semiconductor integrated circuit is mounted on a package, inductive elements 14, 17, and 20, resistance elements 15, 18, and 21, and capacitive elements 16, 19, and 22 (hereinafter referred generically to as passive elements) exist parasitically in this semiconductor circuit. Specifically, a series circuit of the inductive element 14 and resistance element 15 exist parasitically between the power source line VDD and a package VDD pin, and the capacitive element 16 is connected parasitically between the connection node of the inductive element 14 and resistance element 15 and a package GND pin. A series circuit of the inductive element 17 and resistance element 18 exist parasitically between the earth line GND and package GND pin, and the capacitance element 19 is connected parasitically between the connection node of the inductive element 17 and resistance element 18 and the package GND pin. Further, a series circuit of the inductive element 20 and resistance element 21 exist parasitically between a package VOUT pin and output terminal pad VOUT, and the capacitive element 22 is connected parasitically between the connection node of the inductive element 20 and resistance element 21 and the package GND pin. A potential, fluctuating due to the influence of these passive elements, which is called "ringing", is induced at the output terminal pad VOUT, and particularly it will appears remarkably at the time when the output terminal VOUT is subjected to variations from a low to a high level.

For the purpose of suppressing the ringing, the switching operation of the NMOS transistor 3 from an ON state to an OFF state is forced to be delayed by a predetermined period of time, when a potential at the output terminal VOUT changes from a low level to a high level. In order to delay the switching operation of the NMOS transistor 3 from the turned ON state to the turned OFF state for the foregoing period of time, the switching operations of NMOS transistors 4 and 5 from the turned ON state to the turned OFF state are forced to be delayed by a delay circuit 8 by a predetermined period of time which is suitably set, and hence a potential higher than the threshold voltage of the NMOS transistor 3 is generated. Note that the value of the potential is determined by a current flowing from the output terminal OUT to the earth line GND through the NMOS transistors 4, 5, and 2 and by ON resistances of the NMOS transistors 4, 5 and 2. Thus, the NMOS transistor 3 is allowed to be slightly turned ON state for the predetermined period of time determined by the delay circuit 8, so that the ringing can be restrained.

However, when some of passive elements have undesirable large values, or when the transmission line itself have a large electrical characteristic value, the remarkable ringing takes place, which fluctuates up and down across the threshold value of the output circuit. Such the ringing can not be fully restrained. As a result, there has been a problem such that a transmission speed between the semiconductor integrated circuit is made slow.

SUMMARY OF THE INVENTION

An object of the present invention is to provide an output circuit capable of restraining sufficiently occurrence of a ringing.

An output circuit according to the present invention, is featured by comprising an output impedance control circuit in addition to the above basic construction. The output impedance-control circuit includes two transistors coupled in series to maintain an output transistor conductive during a predetermined period of time in response to a change in logic level of a data signal.

According to a preferred embodiment, the output impedance control circuit includes first and second NMOS transistors connected in series between an output terminal and the gate of an output NMOS transistor. The gate of the first NMOS transistor receives the data signal, and the gate of the second NMOS transistor receives an output signal of a delay circuit receiving the level at the gate of the output transistor.

BRIEF DESCRIPTION OF THE DRAWINGS

The above and other objects, advantages and features of the present invention will be more apparent from the following description taken in conjunction with accompanying drawings, in which:

FIG. 4 is an operational diagram showing a ringing characteristic of the output circuits of the present invention, compared to that of the prior art output circuit; and FIGS. 5A and 5B are graphs showing a delay characteristic of the ringing of the output circuits of the first and second embodiments, compared to that of the prior art output circuit, when the output varies from a low level to a high level.

DETAILED DESCRIPTION OF THE PREFERRED EMBODIMENTS

Figure 1:
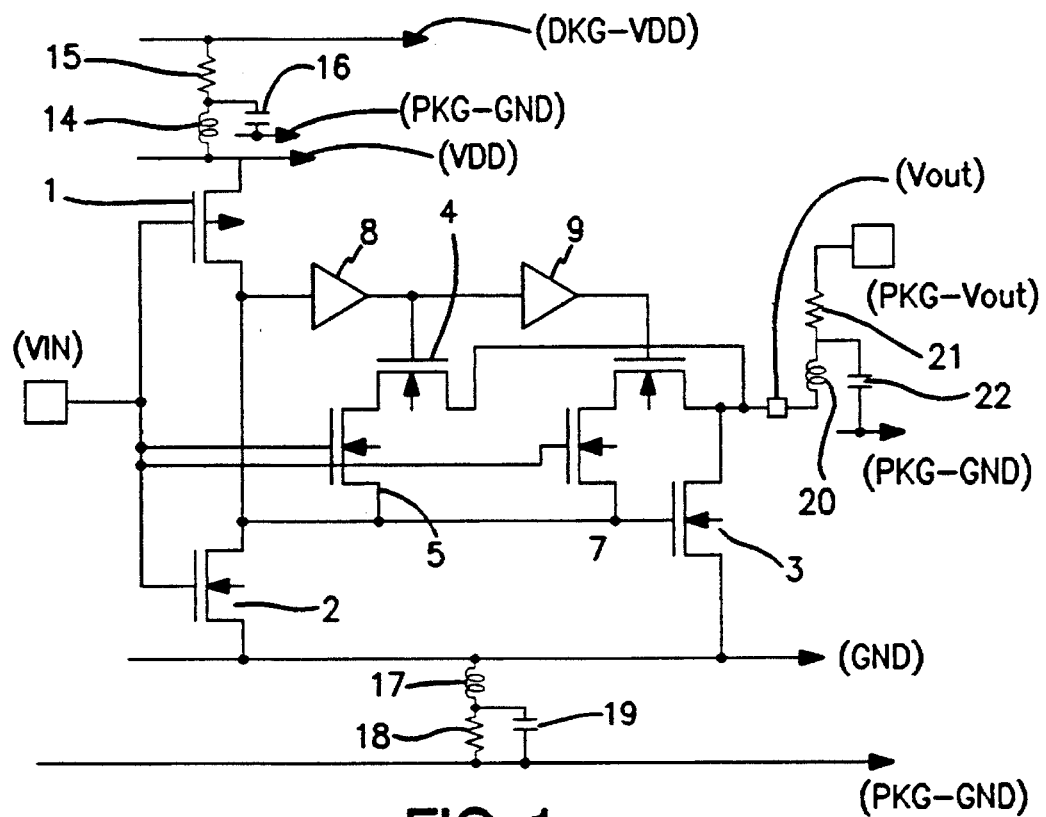
FIG. 1 is a circuit diagram illustrative of an output circuit of a first embodiment of the present invention.

Referring now to FIG. 1, a GTL output circuit according to a first embodiment of the present invention includes PMOS and NMOS transistors 1 and 2, the gates of which are connected in common to an input terminal VIN. This terminal VIN receives a data signal from a data processing circuit (not shown). The sources of the PMOS and NMOS transistors 1 and 2 are connected to a power source line VDD and an earth or ground line GND, respectively. The power source line VDD and the earth line GND are provided on a semiconductor integrated circuit chip which incorporates this output circuit. The drains of the PMOS and NMOS transistors 1 and 2 are connected in common to the gate of an NMOS transistor 3, and the drain and source of the NMOS transistor 3 are connected to an output terminal VOUT and the earth line GND, respectively. The drains of NMOS transistors 4 and 6 are connected in common to the output terminal VOUT, and sources of the NMOS transistors 4 and 6 are connected to the drains of NMOS transistors 5 and 7, respectively. The gates of the NMOS transistors 5 and 7 are connected in common to the input terminal VIN, and the sources thereof are connected in common to the gate of the NMOS transistor 3. The gate of the NMOS transistor 4 is connected to an output terminal of a first delay circuit 8 having an input terminal connected to the node of the transistors 1 and 2. The-output terminal of the delay circuit 8 is also connected to an input terminal of a second delay circuit 9. The gate of the NMOS transistor 6 is connected to an output terminal of the second delay circuit 9. It is to be noted that parasitic active elements 14–22 are the same as those in the conventional output circuit, hence description concerning them are omitted. The output pin PKG-VOUT is connected to a transmission line (not shown).

In operation, it is first assumed that a data signal at the input terminal VIN changes from a low level to a high level. Note here that the low level means a potential approximately equal to an ground potential GND, and the high level means a potential approximately equal to a power source potential VDD. When the input signal changes from the low level to the high level, the PMOS transistor 1 is changed from an ON state to an OFF state, while the NMOS transistor 2 is changed from the OFF state to the ON state. At the same time, the NMOS transistors 5 and 7 are also turned from the OFF state to the ON state. Since the potential level at the connection node of the PMOS and NMOS transistors 1 and 2 is shifted from the high level to the low level the NMOS transistor 3 tends to change from an ON state to an OFF state. However, at this time, each of the delay circuits 8 and 9 maintains each of the transistors 4 and 6 at the ON state. Accordingly, the ON states of the transistors 5 and 7 responsive to the high level of the data signal make two current paths each being formed between the output terminal VOUT and the gate of transistor 3. As a result, the voltage at the gate of the transistor 3 is held at such a level that exceeds the threshold voltage of the transistor 3. The transistor 3 is thereby maintained at the ON state.

The delay circuit 8 changes its output to the low level after the delay time period thereof has elapsed from the time point at which the input voltage thereof becomes lower than its threshold level, and the delay circuit 9 changes its output to the low level after the delay time period thereof has further elapsed. When the transistor 6 is turned OFF by the low level of the delay circuit 9, the transistor 3 is turned off. Thus, the transistor 3 is held at the ON state during a period of time when at least one of the transistors 4 and 6 is being turned ON even when the data signal changes from the low level to the high level.

The periods of time when the transistors 4 and 6 are being turned ON are controlled by the delay times of the first and second delay circuits 8 and 9, respectively. During that periods, two current paths are present, which flow from the output terminal VOUT to the earth line GND. One current path is such one that a current flows from the output terminal VOUT to the earth line GND through the NMOS transistors 4, 5, and 2. The other current path is such one that a current flows from the output terminal VOUT to the earth line GND through the NMOS transistors 6, 7, and 2. The two different kinds of potentials are applied to the gate of the NMOS transistor 3, which change their values according to the passages of the delay times of the first and second delay circuits 8 and 9. The values of the potentials applied to the gate of the NMOS transistor 3 are determined by the ON resistances of the NMOS transistors 4 and 5, and by the so-called ON resistances of the NMOS transistors 6 and 7. Since these two potentials varying according to the passages of the delay times of the first and second delay circuits 8 and 9 are set higher than a threshold voltage of the NMOS transistor 3, the ringing occurred at the output terminal VOUT can be restrained two times, specifically whenever the delay time of the first and second delay circuits 8 and 9 elapses. To restrain ringing sufficiently, it is necessarily required to adjust the potential applied to the gate of the NMOS transistor 3, which varies with time, and the periodic phase difference for maintaining this potential difference. First, as for the potential difference it can be controlled to adjust the gate widths of the NMOS transistors 2, 4, 5, 6, and 7. And as for the periodic phase difference it can be controlled to adjust the delay times of the first and second delay circuits 8 and 9.

Figure 2:
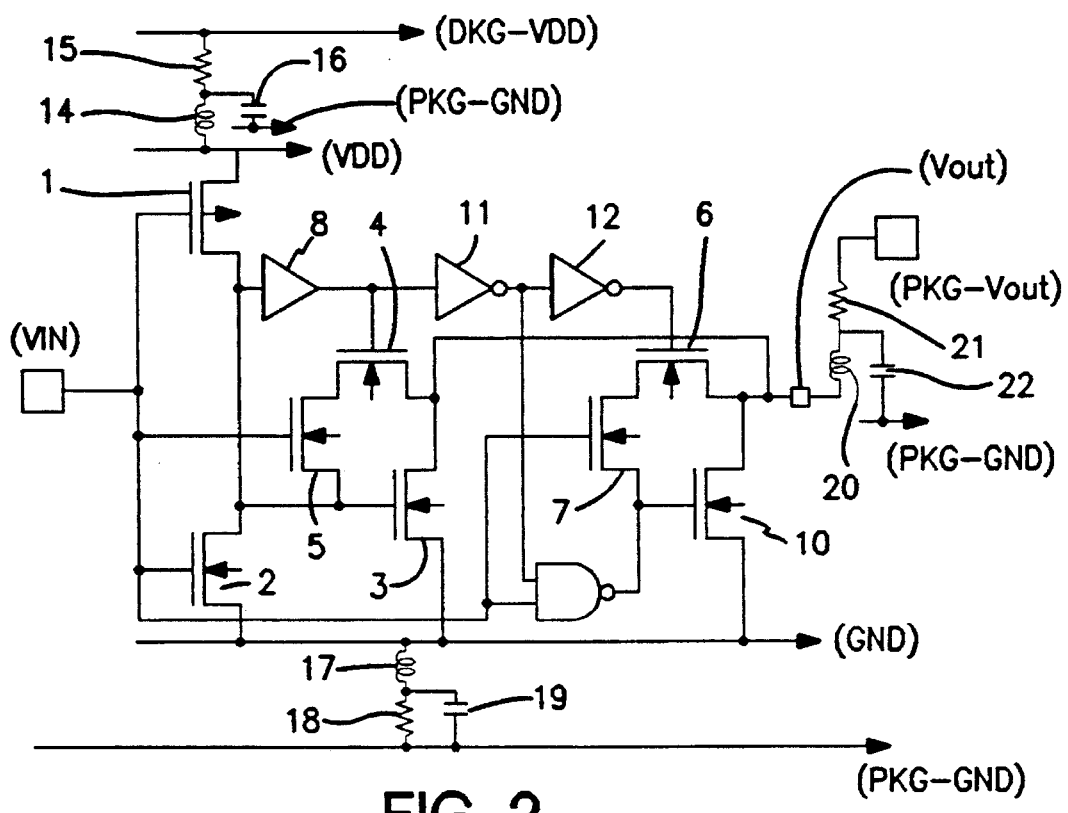
FIG. 2 is a circuit diagram illustrative of an output circuit of a second embodiment of the present invention.
Figure 3:
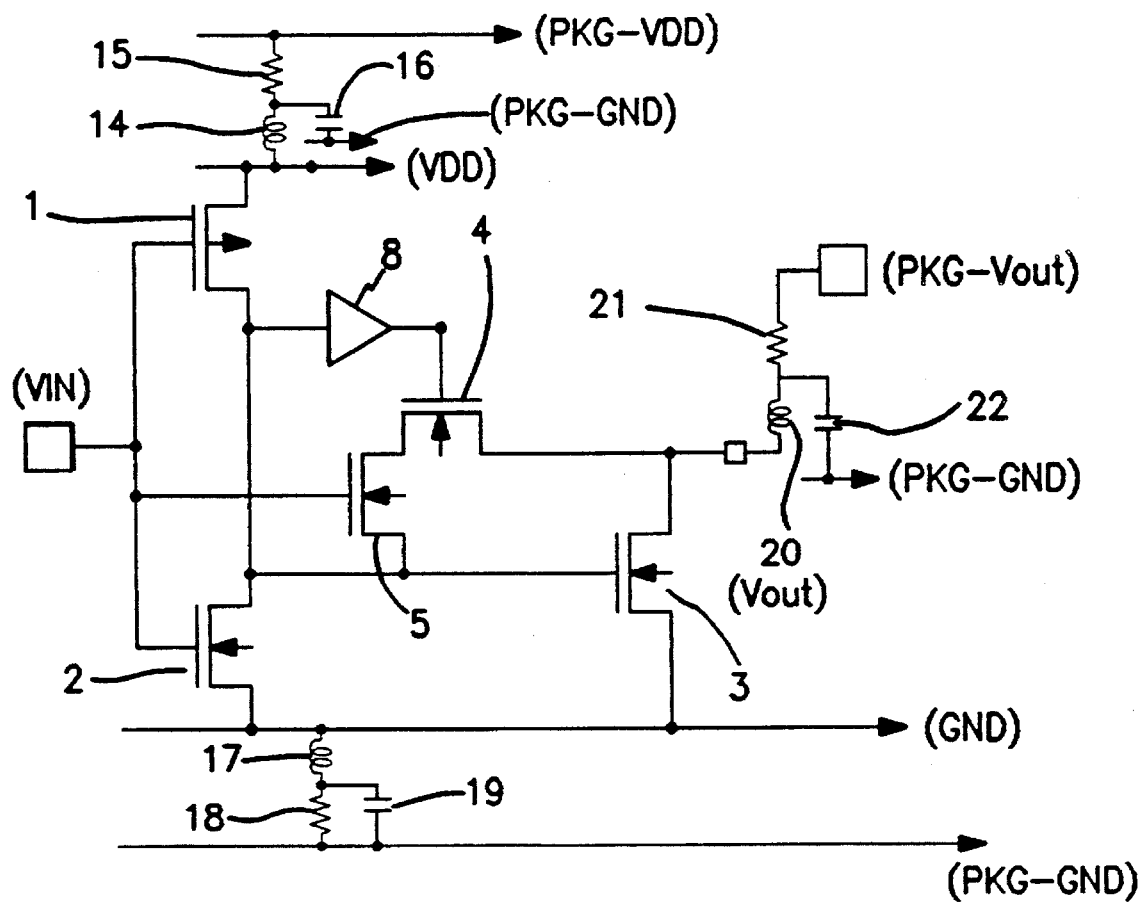
FIG. 3 is a circuit diagram illustrative of an output circuit according to the prior art.

Turning to FIG. 2, the GTL output circuit according to the second embodiment of the present invention includes PMOS and NMOS transistors 1 and 2, the gates of which are connected in common to an input terminal VIN, and the sources of the PMOS and NMOS transistors 1 and 2 are connected to a power source VDD and an earth or ground line GND, respectively. The drains of the PMOS and NMOS transistors 1 and 2 are connected in common to the gate of an NMOS transistor 3, and the drain of the NMOS transistor 3 is connected to an output terminal VOUT. Further, the drain of an NMOS transistor 10 is also connected to the output terminal VOUT. The sources of the NMOS transistors 3 and 10 are connected to the earth line GND. The drains of NMOS transistors 4 and 6 are connected in parallel to the output terminal VOUT, and the sources of NMOS transistors 4 and 6 are connected to the drains of NMOS transistors 5 and 7, respectively. The gates of the NMOS transistors 5 and 7 are connected in common to the input terminal VIN, and the sources of the NMOS transistors 5 and 7 are connected to the gates of the NMOS transistors 3 and 10, respectively. Further, the gate of the NMOS transistor 4 is connected to an input terminal of a second delay circuit 11, as well as to an output terminal of a first delay circuit 8. The gate of the NMOS transistor 6 is connected to an output terminal of a third delay circuit 12. An input terminal of the first delay circuit 8 is connected to the drains of the PMOS and NMOS transistors 1 and 2, and an input terminal of the second delay circuit 11 is connected to the output terminal of the first delay circuit 8. An input terminal of the third delay circuit 12 is connected to an output terminal of the second delay circuit 11.

Note that each of the second and third delay circuits 11 and 12 is an inverting delay circuit, which inverts a signal supplied thereto to output an inverted signal therefrom.

The gate of the NMOS transistor 10 is connected to an output terminal of a two input NAND circuit 13. The first input terminal of the NAND circuit 13 is connected to the input terminal VIN and the second input terminal thereof is connected to the output terminal of the second delay circuit 11 and the input terminal of the third delay circuit 12. Note that parasitic elements other than the above circuit elements are the same as those in the conventional output circuit, hence description concerning them are omitted.

The operation of the above-described output circuit of the second embodiment of the present invention is as follows.

In the first place, it is assumed that an input signal changing from a low level to a high level is applied to the input terminal VIN, where the low level means a potential approximately equal to an earth potential GND, and the high level means a potential approximately equal to a power source potential VDD. When the input signal changes from the low level to the high level, the PMOS transistor 1 is made to change from a turned ON state to a turned OFF state, while the NMOS transistor 2 is made to change from the turned OFF state to the turned ON state. At the same time, the NMOS transistors 5 is also made to change from the turned OFF state to the turned ON state. Since the potential levels at the drains of the PMOS and NMOS transistors 1 and 2 are shifted from a high level to a low level, the NMOS transistor 3 tends to change from a turned ON state to a turned OFF state. However, the level change from the high level to the low level at the drains of the PMOS and NMOS transistors 1 and 2 appears at the output terminal of the first delay circuit 8 after the passage of the predetermined delay time of the first delay circuit 8. Thus, the level change at the output terminal of the first delay circuit 8 forces the NMOS transistor 4 to change from a turned ON state to a turned OFF state. During the time that the NMOS transistor 4 maintains its turned ON state, the gate of the NMOS transistor 3 is supplied with a potential. This potential has such a level that is determined by a current from the output terminal VOUT to the earth line GND through the NMOS transistors 4, 5, and 2 and by the on resistances thereof. Hence, the NMOS transistor 3 maintains its slightly turned ON state. The NMOS transistor 4 is made to change from the ON state to OFF state, immediately after the passage of the delay time of the first delay circuit 8. At the same time, the NMOS transistor 3 changes its ON state to the OFF state. Thereafter, after the passage of the predetermined delay time of the second delay circuit 11, a potential at the second input terminal of the NAND circuit changes from a low level to a high level. Therefore, after the passage of the delay time of the NAND circuit 13, an output from the NAND circuit 13 changes its level from high to low, hence the NMOS transistor 10 tends to change from the ON state to the OFF state. However, after the passage of the delay time of the third delay circuit 12, the changes of the low level to the high level at the output terminal of the second delay circuit 8 appears at the output terminal of the third delay circuit 12. Therefore, when the sum of the delay times of the second and third delay circuits 11 and 12 elapsed from the time of the turned ON operation of the NMOS transistor 4, the NMOS transistor 6 is made to change from the turned ON state to the turned OFF state.

During the time of the ON state of the NMOS transistor 6, the NMOS transistor 10 maintains its slightly ON state, since the gate of the NMOS transistor 10 is applied with a potential, the level of which is determined by a current which flows from the output terminal VOUT to the earth line GND through the NMOS transistors 6 and 7 and the NAND circuit 13 and by the ON resistances of the NMOS transistors 6 and 7 and the NAND gate. Further, the NMOS transistor 6 is made to change from a turned ON state to a turned OFF state, when the predetermine delay time of the third delay circuit 12 elapses. At the same time, the NMOS transistor 10 changes from the ON state to the OFF state.

As described above, the NMOS transistors 3 and 10 change from the ON state to the OFF state with the periodic phase difference. Specifically, the NMOS transistor 10 is made to change to the OFF state after the passage of the sum of the delay times of the delay circuits 11 and 12. In other words, the NMOS transistor 3 and 10 are turned off with the periodic phase difference determined by the sum of the delay times of the second and third delay circuits 11 and 12. Therefore, the ringing occurred in the output terminal VOUT can be restrained at two different stages. In addition, since the NMOS transistors 3 and 10 maintain the slightly ON states during the time of the ON states of the NMOS transistors 4 and 6, respectively, the ringing can be restrained at further different stages.

FIG. 4 is an operational diagram showing a ringing characteristic of the output circuits of the present invention, compared to that of the prior art output circuit. As is shown in FIG. 4, the prior art output circuit produces large overshoots OS and backswings BS, and the value of the backswings BS exceed, many times, a threshold value of the NMOS transistor 3. On the contrary, the output circuits of the first and second embodiments of the present invention show that the ringing can be sufficiently restrained.

FIGS. 5A and 5B are graphs showing a delay characteristic of the ringing of the output circuits of the first and second embodiments, compared to that of the prior art output circuit, when the output varies from a low level to a high level. As is apparent from FIGS. 5A and 5B, in the output circuits of the first and second embodiments of the present invention, a high speed performance of the delay characteristic can be achieved by reducing largely the ringing.

As described above, the output circuit of the present invention makes it possible to restrain sufficiently the ringing occurred by active elements and bus lines, having large electric characteristics, which are incorporated in a semiconductor integrated circuit. Thus, high speed signal transmissions between input and output terminals of the semiconductor integrated circuit connected to the bus lines can be achieved, and at the same time high quality signals without rounding can be obtained.

It should be understood that various alternatives to the embodiment of the present invention described herein may be implied in practicing the present invention. It is intended that the following claims defined the scope of the present invention and that structures within the scope of these claims and their equivalents be covered thereby.

What is claimed is:

1. An output circuit comprising an input terminal supplied with a data signal, a first transistor of a first conductivity type having a gate coupled to said input terminal, a second transistor of a second conductivity type having a gate coupled to said input terminal, said first and second transistors being coupled in series between first and second power lines, a third transistor of the first conductivity type having a gate coupled to a connection node of said first and second transistors, said third transistor being coupled between an output terminal and said second power line, fourth and fifth transistors each of the first conductivity type coupled in series between said output terminal and the gate of said third field effect transistor, and said fifth field effect transistor having a gate coupled to said input terminal, a first delay circuit coupled between said connection node and a gate of said fourth field effect transistor, and an output impedance control circuit coupled to said output terminal and controlling an impedance at said output terminal when said data signal changes.

2. The output circuit as claimed in claim 1, wherein said output impedance control circuit comprises sixth and seventh transistors each of the first conductivity type, coupled in series between said output terminal and the gate of said third field effect transistor and a second delay circuit coupled between said first delay circuit and a gate of said sixth transistor, said seventh transistor having a gate coupled to said input terminal.

3. The output circuit as claimed in claim 1, wherein said output impedance control circuit comprises an eighth field effect transistor of the first conductivity type coupled between said output terminal and said second power source line, ninth and tenth transistors coupled in series between said output terminal and a gate of said eighth field effect transistor, second and third delay circuits coupled in series between said first delay circuit and a gate of said ninth field effect transistor, and a logic circuit having a first input node coupled to said input terminal, a second input node coupled to an output terminal of said second delay circuit and an output node coupled to a gate of said eighth field effect transistor, said tenth field effect transistor having a gate coupled to said input terminal.

4. The output circuit as claimed in claim 3, wherein said logic circuit is a NAND gate.

5. An output circuit comprising first and second transistors coupled in series between first and second power lines, means responsive to a data signal for controlling said first and second transistors in a complementary manner, a third transistor coupled between an output terminal and said first power line and having a gate coupled to a node of said first and second transistors, fourth and fifth transistors coupled in series between said output terminal and the gate of said third transistor, sixth and seventh transistors coupled in series between said output terminal and the gate of said third transistor, each of said fifth and seventh transistors having a gate coupled to receive said data signal, a first delay circuit coupled between said node and a gate of said fourth transistor, and a second delay circuit coupled between said first delay circuit and a gate of said sixth transistor.

6. An output circuit comprising first and second transistors coupled in series between first and second power lines, means responsive to a data signal for controlling said first and second transistors in a complementary manner, a third transistor coupled between an output terminal and said first power line and having a gate coupled to a node of said first and second transistors, fourth and fifth transistors coupled in series between said output terminal and the gate of said third transistor, said fifth transistor having a gate coupled to receive said data signal, a first delay circuit coupled between said node and a gate of said fourth transistor, a sixth transistor coupled between said output terminal and said first power line, seventh and eighth transistors coupled in series between said output terminal and a gate of said sixth transistor, said eighth transistor having a gate coupled to receive said data signal, second and third delay circuits coupled in series between said first delay circuit and a gate of said seventh transistor, and a logic gate circuit having a first input node receiving said data signal, a second input node coupled to a connection point of said second and third delay circuits and an output node coupled to a gate of said sixth transistor.

* * * * *